US012777685B2

(12) United States Patent
Zhang et al.

(10) Patent No.: US 12,777,685 B2
(45) Date of Patent: Oct. 27, 2026

(54) SEMICONDUCTOR DEVICE AND MANUFACTURING METHOD THEREOF

(71) Applicant: INNOSCIENCE (SUZHOU) SEMICONDUCTOR CO., LTD., Jiangsu (CN)

(72) Inventors: Jianfa Zhang, Guangdong (CN); Sichao Li, Guangdong (CN)

(73) Assignee: INNOSCIENCE (SUZHOU) SEMICONDUCTOR CO., LTD., Jiangsu (CN)

( * ) Notice: Subject to any disclaimer, the term of this patent is extended or adjusted under 35 U.S.C. 154(b) by 383 days.

(21) Appl. No.: 18/575,295

(22) PCT Filed: Nov. 28, 2022

(86) PCT No.: PCT/CN2022/134605
§ 371 (c)(1),
(2) Date: Dec. 28, 2023

(87) PCT Pub. No.: WO2024/113076
PCT Pub. Date: Jun. 6, 2024

(65) Prior Publication Data

US 2025/0081533 A1 Mar. 6, 2025

(51) Int. Cl.
*H10D 30/67* (2025.01)
*H10D 30/01* (2025.01)
(Continued)

(52) U.S. Cl.
CPC ......... *H10D 30/675* (2025.01); *H10D 30/015* (2025.01); *H10D 30/475* (2025.01);
(Continued)

(58) Field of Classification Search
None
See application file for complete search history.

(56) References Cited

U.S. PATENT DOCUMENTS 4,635,343 A * 1/1987 Kuroda .............. H10D 30/4755 257/E27.068
9,559,012 B1 * 1/2017 Chu ..................... H10D 30/015
(Continued)

FOREIGN PATENT DOCUMENTS

CN 112786700 5/2021
CN 115241288 10/2022
(Continued)

OTHER PUBLICATIONS

"International Search Report (Form PCT/ISA/210) of PCT/CN2022/134605," mailed on Aug. 3, 2023, pp. 1-3.
(Continued)

*Primary Examiner* — Nishath Yasmeen
(74) *Attorney, Agent, or Firm* — JCIPRNET

(57) ABSTRACT

The present disclosure provides a semiconductor device and a manufacturing method thereof. The semiconductor device includes a substrate, a first nitride semiconductor layer, a second nitride semiconductor layer, a first doped nitride semiconductor layer, and a second doped nitride semiconductor layer. The first nitride semiconductor layer is formed on the substrate. The second nitride semiconductor layer is formed on the first nitride semiconductor layer and has a band gap greater than a band gap of the first nitride semiconductor layer. The first doped nitride semiconductor layer is formed on the second nitride semiconductor layer. The second doped nitride semiconductor layer is formed on the second nitride semiconductor layer. A dopant of the first doped nitride semiconductor layer is different from a dopant of the second doped nitride semiconductor layer.

20 Claims, 10 Drawing Sheets

10

(51) Int. Cl.
*H10D 30/47* (2025.01)
*H10D 62/85* (2025.01)
*H10D 64/01* (2025.01)
*H10D 64/64* (2025.01)
*H10P 32/30* (2026.01)

(52) U.S. Cl.
CPC ......... *H10D 30/6738* (2025.01); *H10D 62/85* (2025.01); *H10D 62/8503* (2025.01); *H10D 64/0124* (2026.01); *H10D 64/64* (2025.01); *H10P 32/30* (2026.01)

(56) References Cited

U.S. PATENT DOCUMENTS

| | | | | |
|---|---|---|---|---|
| 10,777,653 B2 * | 9/2020 | Ni | H10D 30/015 |
| 11,522,077 B2 * | 12/2022 | Kwan | H10D 30/015 |
| 2021/0296311 A1 * | 9/2021 | Iwao | H10D 30/015 |
| 2022/0376041 A1 * | 11/2022 | Hu | H10D 30/015 |
| 2023/0207679 A1 * | 6/2023 | Hou | H10D 30/4732 257/183 |

FOREIGN PATENT DOCUMENTS

| | | | |
|---|---|---|---|
| CN | 116387314 A * | 7/2023 | H10D 84/0123 |
| KR | 101480068 | 1/2015 | |

OTHER PUBLICATIONS

"Written Opinion of the International Searching Authority (Form PCT/ISA/237) of PCT/CN2022/134605," mailed on Aug. 3, 2023, pp. 1-3.

* cited by examiner

20

20

20

SEMICONDUCTOR DEVICE AND MANUFACTURING METHOD THEREOF

CROSS-REFERENCE TO RELATED APPLICATION

This application is a 371 of international application of PCT application serial no. PCT/CN2022/134605, filed on Nov. 28, 2022. The entirety of the above mentioned patent application is hereby incorporated by reference herein and made a part of this specification.

BACKGROUND

1. Technical Field

The present disclosure relates to a semiconductor device and a manufacturing method thereof, and more particularly to a semiconductor device including different types of doped nitride semiconductor layers and a manufacturing method thereof.

2. Description of the Related Art

Components that include direct bandgap semiconductors, for example, semiconductor components including group III-V materials or group III-V compounds (Category: III-V compounds), can operate or work under a variety of conditions or in a variety of environments (e.g., at different voltages and frequencies) due to their characteristics.

The semiconductor components may include a heterojunction bipolar transistor (HBT), a heterojunction field effect transistor (HFET), a high-electron-mobility transistor (HEMT), a modulation-doped FET (MODFET) and the like.

SUMMARY

In some embodiments of the present disclosure, a semiconductor device is provided. The semiconductor device includes a substrate, a first nitride semiconductor layer, a second nitride semiconductor layer, a first doped nitride semiconductor layer, and a second doped nitride semiconductor layer. The first nitride semiconductor layer is formed on the substrate. The second nitride semiconductor layer is formed on the first nitride semiconductor layer and has a band gap greater than a band gap of the first nitride semiconductor layer. The first doped nitride semiconductor layer is formed on the second nitride semiconductor layer. The second doped nitride semiconductor layer is formed on the second nitride semiconductor layer. A dopant of the first doped nitride semiconductor layer is different from a dopant of the second doped nitride semiconductor layer.

In some embodiments of the present disclosure, a semiconductor device is provided. The semiconductor device includes a first operating device and a second operating device. The first operating device includes a first doped nitride semiconductor layer and a first conductive structure. The first doped nitride semiconductor layer is formed on a second nitride semiconductor layer. The second nitride semiconductor layer is on the first nitride semiconductor layer and the second nitride semiconductor layer has a band gap greater than a band gap of the first nitride semiconductor layer. The first conductive structure is formed on the first doped nitride semiconductor layer. The second operating device is separated from the first operating device and includes a second doped nitride semiconductor layer and a second conductive structure. The second doped nitride semiconductor layer is formed on the second nitride semiconductor layer. The second conductive structure is formed on the second doped nitride semiconductor layer. The first doped nitride semiconductor layer and the second doped nitride semiconductor layer have substantially identical thickness.

In some embodiments of the present disclosure, a method for manufacturing a semiconductor device is provided. The method includes forming a substrate; forming a first nitride semiconductor layer on the substrate; forming a second nitride semiconductor layer on the first nitride semiconductor layer, the second nitride semiconductor layer having a band gap greater than a band gap of the first nitride semiconductor layer; forming a first doped nitride semiconductor layer on the second nitride semiconductor layer; forming a dielectric layer on the second nitride semiconductor layer; and performing an ion implantation on a first region of the first doped nitride semiconductor layer to form a second doped nitride semiconductor layer.

The enhancement-mode semiconductor device and the depletion-mode semiconductor device can be provided or integrated for one semiconductor device by utilizing, for example, the photo mask or the ion implantation. The manufacturing process can be simple without requiring multiple photo masks. In some embodiments, the doped nitride semiconductor layer of the semiconductor device can be transformed into N-type doping from P-type doping by applying ion implantation. Accordingly, the damage to the nitride semiconductor layer can be decreased due to the applied ion implantation. The thickness of the nitride semiconductor layer can be controlled accurately. The uniformity and reliability such as the threshold voltage of the semiconductor device can thus be improved.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may have arbitrarily increased or reduced for clarity of discussion.

DETAILED DESCRIPTION

Figure 1:
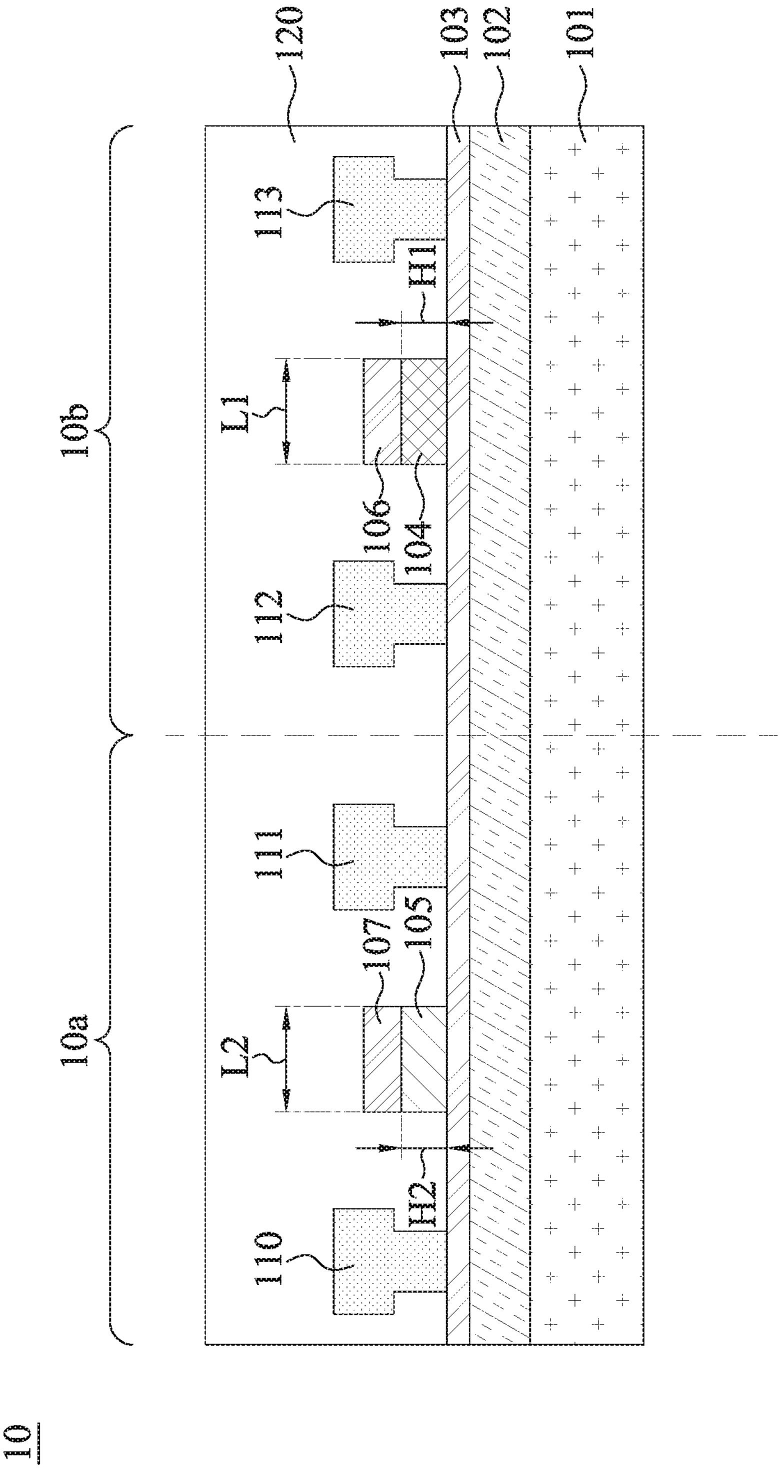
FIG. 1 is a cross-sectional view of a semiconductor device according to some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may have formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

A direct band gap material, such as a group III-V compound, may include but is not limited to, for example, gallium arsenide (GaAs), indium phosphide (InP), gallium nitride (GaN), Indium gallium arsenide (InGaAs), Indium aluminum arsenide (InAlAs), and the like.

FIG. 1 is a cross-sectional view of a semiconductor device 10 according to some embodiments of the present disclosure.

The semiconductor device 10 may include an operating device 10*a* and an operating device 10*b*. The operating device 10*a* can be arranged adjacent to the operating device 10*b*. In some embodiments, the operating device 10*a* can include an enhancement-mode semiconductor device. In some embodiments, the operating device 10*b* can include a depletion-mode semiconductor device. Both the enhancement-mode semiconductor device and the depletion-mode semiconductor device can be provided or integrated for the semiconductor device 10.

As shown in FIG. 1, the semiconductor device 10 may include a substrate 101, a nitride semiconductor layer 102, a nitride semiconductor layer 103, a doped nitride semiconductor layer 104, a doped nitride semiconductor layer 105, a passivation layer 120, and a plurality of conductive structures 106, 107, 110, 111, 112 and 113.

The substrate 101 may include, for example, but is not limited to, silicon (Si), doped silicon (doped Si), silicon carbide (SiC), germanium silicide (SiGe), gallium arsenide (GaAs), or another semiconductor material. In some embodiments, the substrate 101 may include an intrinsic semiconductor material. In some embodiments, the substrate 101 may include a P-type semiconductor material. In some embodiments, the substrate 101 may include a silicon layer doped with boron (B). In some embodiments, the substrate 101 may include a silicon layer doped with gallium (Ga). In some embodiments, the substrate 101 may include an n-type semiconductor material. In some embodiments, the substrate 101 may include a silicon layer doped with arsenic (As). In some embodiments, the substrate 101 may include a silicon layer doped with phosphorus (P).

The nitride semiconductor layer 102 may be disposed on the substrate 101. The nitride semiconductor layer 102 may include group III-V materials. The nitride semiconductor layer 102 may be a nitride semiconductor layer. The nitride semiconductor layer 102 may include, for example, but is not limited to, group III nitride. The nitride semiconductor layer 102 may include, for example, but is not limited to, GaN. The nitride semiconductor layer 102 may include, for example, but is not limited to, AlN. The nitride semiconductor layer 102 may include, for example, but is not limited to, InN. The nitride semiconductor layer 102 may include, for example, but is not limited to, compound $In_xAl_yGa_{1-x-y}N$, where $x+y\leq1$. The nitride semiconductor layer 102 may include, for example, but is not limited to, compound $Al_yGa_{(1-y)}N$, where $y\leq1$.

The nitride semiconductor layer 103 may be disposed on the nitride semiconductor layer 102. The nitride semiconductor layer 103 may include group III-V materials. The nitride semiconductor layer 103 may be a nitride semiconductor layer. The nitride semiconductor layer 103 may include, for example, but is not limited to, group III nitride. The nitride semiconductor layer 103 may include, for example, but is not limited to, compound $Al_yGa_{(1-y)}N$, where $y\leq1$. The nitride semiconductor layer 103 may include, for example, but is not limited to, GaN. The nitride semiconductor layer 103 may include, for example, but is not limited to, AlN. The nitride semiconductor layer 103 may include, for example, but is not limited to, InN. The nitride semiconductor layer 103 may include, for example, but is not limited to, compound $In_xAl_yGa_{1-x-y}N$, where $x+y\leq1$.

A heterojunction may be formed between the nitride semiconductor layer 103 and the nitride semiconductor layer 102. The nitride semiconductor layer 103 may have a band gap greater than a band gap of the nitride semiconductor layer 102. For example, the nitride semiconductor layer 103 may include AlGaN that may have a band gap of about 4 eV, and the nitride semiconductor layer 102 may include GaN that may have a band gap of about 3.4 eV.

In the semiconductor device 10, the nitride semiconductor layer 102 may be used as a channel layer. In the semiconductor device 10, the nitride semiconductor layer 102 may be used as a channel layer disposed on a buffer layer (not shown). In the semiconductor device 10, the nitride semiconductor layer 103 may be used as a barrier layer. In the semiconductor device 10, the nitride semiconductor layer 103 may be used as a barrier layer disposed on the nitride semiconductor layer 102.

In the semiconductor device 10, because the band gap of the nitride semiconductor layer 102 is less than the band gap of the nitride semiconductor layer 103, two dimensional electron gas (2DEG) may be formed in the nitride semiconductor layer 102. In the semiconductor device 10, because the band gap of the nitride semiconductor layer 102 is less than the band gap of the nitride semiconductor layer 103, 2DEG may be formed in the nitride semiconductor layer 102, and the 2DEG is close to the interface of the nitride semiconductor layer 103 and the nitride semiconductor layer 102. In the semiconductor device 10, because the band gap of the nitride semiconductor layer 103 is greater than the band gap of the nitride semiconductor layer 102, 2DEG may be formed in the nitride semiconductor layer 102. In the semiconductor device 10, because the band gap of the nitride semiconductor layer 103 is greater than the band gap of the nitride semiconductor layer 102, 2DEG may be formed in the nitride semiconductor layer 102, and the 2DEG is close to the interface of the nitride semiconductor layer 103 and the nitride semiconductor layer 102.

The doped nitride semiconductor layer 104 may be disposed over the nitride semiconductor layer 103. The doped nitride semiconductor layer 104 may be in direct contact with the nitride semiconductor layer 103. The doped nitride semiconductor layer 104 may cover a portion of the nitride semiconductor layer 103. The doped nitride semiconductor layer 104 may include N-type doped material. The doped nitride semiconductor layer 104 may include a group 4A element. The doped nitride semiconductor layer 104 may include, for example, carbon, silicon, or germanium, but is not limited thereto. The doped nitride semiconductor layer 104 may include, for example, hydrogen, but is not limited thereto. The doped nitride semiconductor layer 104 may have length L1 and height H1.

The doped nitride semiconductor layer 105 may be disposed over the nitride semiconductor layer 103. The doped nitride semiconductor layer 105 may be in direct contact with the nitride semiconductor layer 103. The doped nitride semiconductor layer 105 may cover a portion of the nitride semiconductor layer 103. The doped nitride semiconductor layer 105 may include P-type doped material. The doped nitride semiconductor layer 105 may have length L2 and height H2.

The length L2 may be substantially identical to the length L1. The length L2 may be different from the length L1. The length L2 may be smaller than the length L1. The length L2 may be greater than the length L1. The height H2 may be substantially identical to the height H1. The height H2 may be different from the height H1. The height H2 may be smaller than the height H1. The height H2 may be greater than the height H1.

The conductive structure 106 may be disposed on the doped nitride semiconductor layer 104. The conductive structure 106 may be in direct contact with the doped nitride semiconductor layer 104. The conductive structure 106 may be surrounded by a passivation layer 120. The conductive structure 106 may be separated from the conductive structure 112. The conductive structure 106 may be separated from the conductive structure 113. The conductive structure 106 may include a metal. The conductive structure 106 may include, for example, but is not limited to, gold (Au), platinum (Pt), titanium (Ti), palladium (Pd), nickel (Ni), or tungsten (W). The conductive structure 106 may include a metal compound. The conductive structure 106 may include, for example, but is not limited to, TiN.

In the semiconductor device 10, the conductive structure 106 may be used as a gate electrode. In the semiconductor device 10, the conductive structure 106 may be configured to control the 2DEG in the nitride semiconductor layer 102. In the semiconductor device 10, a voltage may be applied to the conductive structure 18 to control the 2DEG in the nitride semiconductor layer 102. In the semiconductor device 10, a voltage may be applied to the conductive structure 106 to control the 2DEG in the nitride semiconductor layer 102 and below the conductive structure 106. In the semiconductor device 10, a voltage may be applied to the conductive structure 106 to control the connection or disconnection between the conductive structure 112 and the conductive structure 113.

The conductive structure 107 may be disposed on the doped nitride semiconductor layer 105. The conductive structure 107 may be in direct contact with the doped nitride semiconductor layer 105. The conductive structure 107 may be surrounded by a passivation layer 120. The conductive structure 107 may be separated from the conductive structure 110. The conductive structure 107 may be separated from the conductive structure 111. The conductive structure 107 may include a metal. The conductive structure 107 may include, for example, but is not limited to, gold (Au), platinum (Pt), titanium (Ti), palladium (Pd), nickel (Ni), or tungsten (W). The conductive structure 107 may include a metal compound. The conductive structure 107 may include, for example, but is not limited to, TiN.

In the semiconductor device 10, the conductive structure 107 may be used as a gate electrode. In the semiconductor device 10, the conductive structure 107 may be configured to control the 2DEG in the nitride semiconductor layer 102. In the semiconductor device 10, a voltage may be applied to the conductive structure 18 to control the 2DEG in the nitride semiconductor layer 102. In the semiconductor device 10, a voltage may be applied to the conductive structure 107 to control the 2DEG in the nitride semiconductor layer 102 and below the conductive structure 107. In the semiconductor device 10, a voltage may be applied to the conductive structure 107 to control the connection or disconnection between the conductive structure 110 and the conductive structure 111.

The conductive structures 110, 111, 112 and 113 may be disposed over the nitride semiconductor layer 103. The conductive structures 110, 111, 112 and 113 may be in direct contact with the nitride semiconductor layer 103. The conductive structure 107 can be formed between the conductive structures 110 and 111. The conductive structure 106 can be formed between the conductive structures 112 and 113.

Each of the conductive structures 110, 111, 112 and 113 may include a conductive material. Each of the conductive structures 110, 111, 112 and 113 may include a metal. Each of the conductive structures 110, 111, 112 and 113 may include, for example, but is not limited to, Al. Each of the conductive structures 110, 111, 112 and 113 may include, for example, but is not limited to, Ti. Each of the conductive structures 110, 111, 112 and 113 may include a metal compound. Each of the conductive structures 110, 111, 112 and 113 may include, for example, but is not limited to, AlN. Each of the conductive structures 110, 111, 112 and 113 may include, for example, but is not limited to, TiN.

In the semiconductor device 10, each of the conductive structures 110, 111, 112 and 113 may be used as, for example, but is not limited to, a source electrode. In the semiconductor device 10, each of the conductive structures 110, 111, 112 and 113 may be used as, for example, but is not limited to, a drain electrode.

FIG. 2A, FIG. 2B, FIG. 2C, FIG. 2D, FIG. 2E, FIG. 2F and FIG. 2G illustrate several operations for manufacturing a semiconductor device 20 according to some embodiments of the disclosure. The semiconductor device 20 may correspond to or can be similar to the semiconductor device 10 of FIG. 1.

Figure 2A:
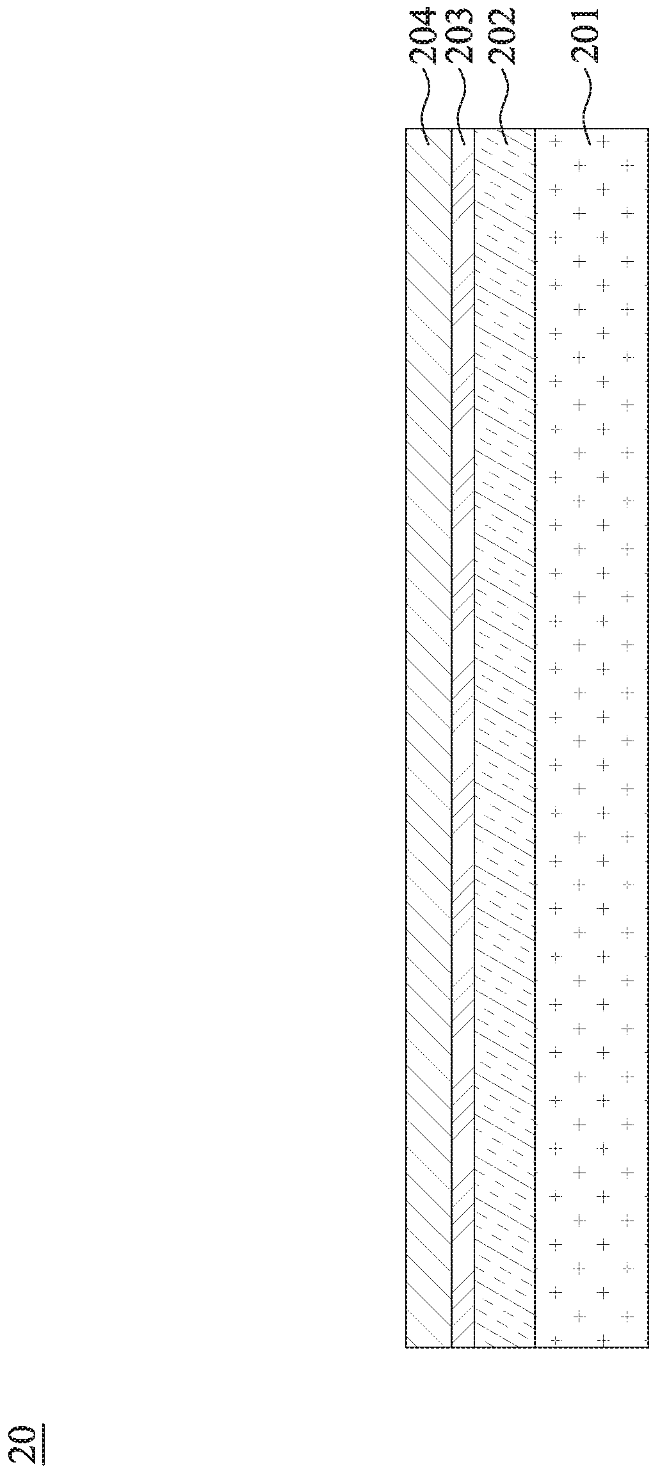
FIG. 2A, FIG. 2B, FIG. 2C, FIG. 2D, FIG. 2E, FIG. 2F and FIG. 2G illustrate several operations for manufacturing a semiconductor device according to some embodiments of the present disclosure.

As shown in FIG. 2A, the semiconductor device 20 can include a substrate 201, a nitride semiconductor layer 202, a nitride semiconductor layer 203 and a doped nitride semiconductor layer 204. The nitride semiconductor layer 202 may be formed on the substrate 201. The nitride semiconductor layer 202 may be formed through CVD and/or another suitable deposition step. The nitride semiconductor layer 203 may be formed on the nitride semiconductor layer 202. The nitride semiconductor layer 203 may be formed through CVD and/or another suitable deposition step. The doped nitride semiconductor layer 204 may be formed on the nitride semiconductor layer 203. The doped nitride semiconductor layer 204 may include an epitaxial layer. The doped nitride semiconductor layer 204 may be formed through CVD and/or another suitable deposition step.

The nitride semiconductor layer 203 may be formed after forming the nitride semiconductor layer 202. A heterojunction may be formed when the nitride semiconductor layer 203 is disposed on the nitride semiconductor layer 202. A band gap of the nitride semiconductor layer 203 may be greater than a band gap of the nitride semiconductor layer 202. Due to the polarization phenomenon of the formed heterojunction between the nitride semiconductor layer 203 and the nitride semiconductor layer 202, 2DEG may be formed in the nitride semiconductor layer 202. Due to the polarization phenomenon of the formed heterojunction between the nitride semiconductor layer 203 and the nitride semiconductor layer 202, 2DEG may be formed in the nitride semiconductor layer 202 and close to an interface between the nitride semiconductor layer 202 and the nitride semiconductor layer 203.

Figure 2B:
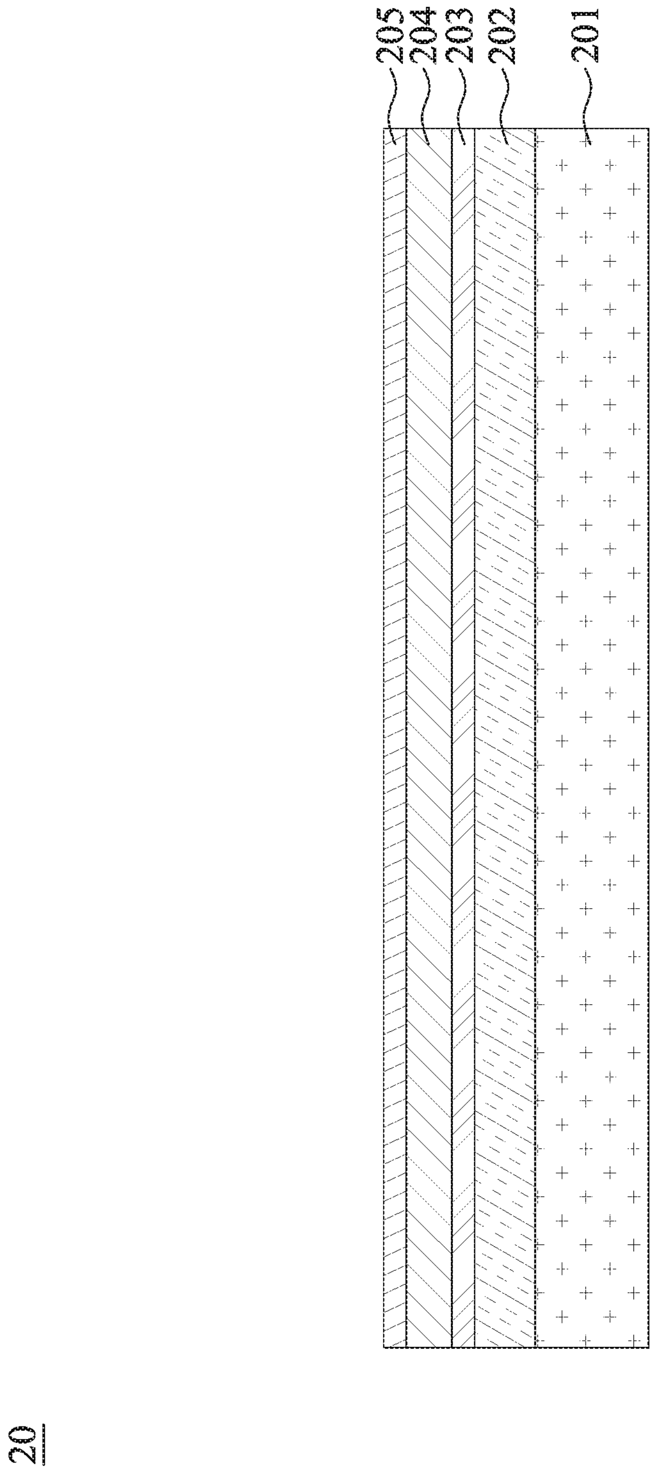

Referring to FIG. 2B, the dielectric layer 205 may be formed on the doped nitride semiconductor layer 204. The dielectric layer 205 may be formed through CVD and/or another suitable deposition step. The dielectric layer 205 can be used as a block layer for implanting ions into the doped nitride semiconductor layer 204 and protecting the nitride semiconductor layer 203 from damage. The dielectric layer 205 may include, for example, but is not limited to, an oxide material. The dielectric layer 205 may include, for example, but is not limited to, a nitride material.

Figure 2C:
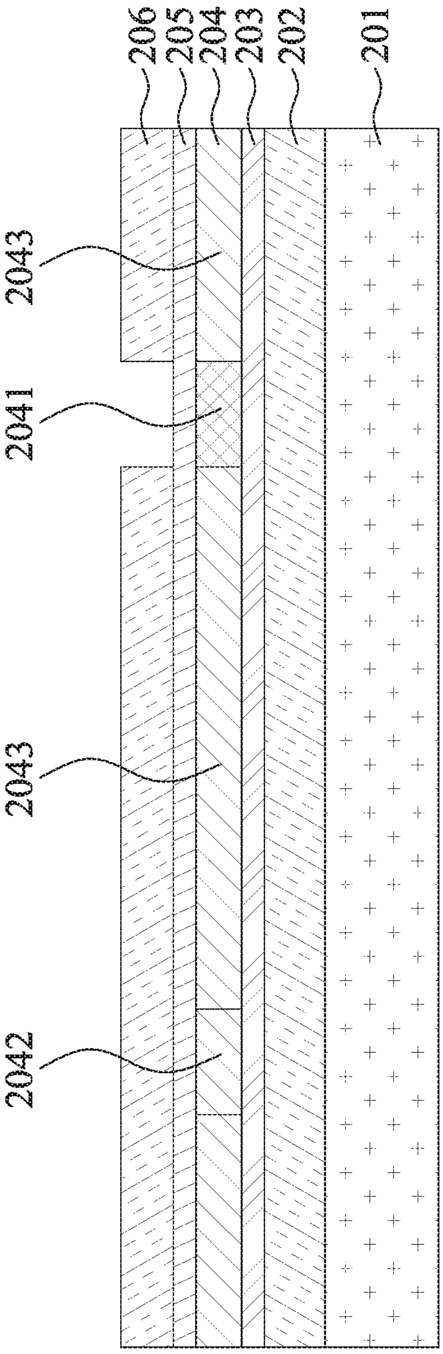

Referring to FIG. 2C, a photo mask 206 can be applied or attached over the dielectric layer 205. The photo mask 206 may be used to perform a manufacturing operation, for example, ion implantation. The photo mask 206 may be used to perform a manufacturing operation, for example, diffusion. The photo mask 206 may be used to create the doped nitride semiconductor layer 2041 whose dopant is different from the dopant of other regions of the doped nitride semiconductor layer 204. The photo mask 206 may be used to generate the doped nitride semiconductor layer 2041 whose dopant is different from the dopant of the doped nitride semiconductor layers 2042 and 2043.

In some embodiments, the doped nitride semiconductor layer 2041 may include N-type doped material. In some embodiments, the doped nitride semiconductor layer 2042 may include P-type doped material. The doped nitride semiconductor layer 2041 may include a group 4A element. The doped nitride semiconductor layer 2041 may include, for example, carbon, silicon, or germanium, but is not limited thereto. The doped nitride semiconductor layer 2041 may include, for example, hydrogen, but is not limited thereto.

In some embodiments, the characteristics of the semiconductor device 20, such as the threshold voltage, the parasitic capacitor, the parasitic inductor and the intrinsic delay, can be adjusted by the manufacturing operation of ion implantation. The characteristics of the semiconductor device 20 can be controlled by, for example, adjusting the type of the implanted ions. The characteristics of the semiconductor device 20 can be controlled by, for example, adjusting the injection energy of the implanted ions. The characteristics of the semiconductor device 20 can be controlled by, for example, adjusting the dosage or concentration of the implanted ions. The characteristics of the semiconductor device 20 can be controlled by, for example, adjusting the injection angel of the implanted ions. The characteristics of the semiconductor device 20 can be controlled by, for example, adjusting the injection area of the implanted ions.

The doped nitride semiconductor layer 2041 can be transformed into N-type doping from P-type doping by applying ion implantation. The damage to the nitride semiconductor layer 203 can be decreased due to the applied ion implantation. The thickness of the nitride semiconductor layer 203 can be accurately controlled. The uniformity and reliability such as the threshold voltage of the semiconductor device 20 can be improved.

Figure 2D:
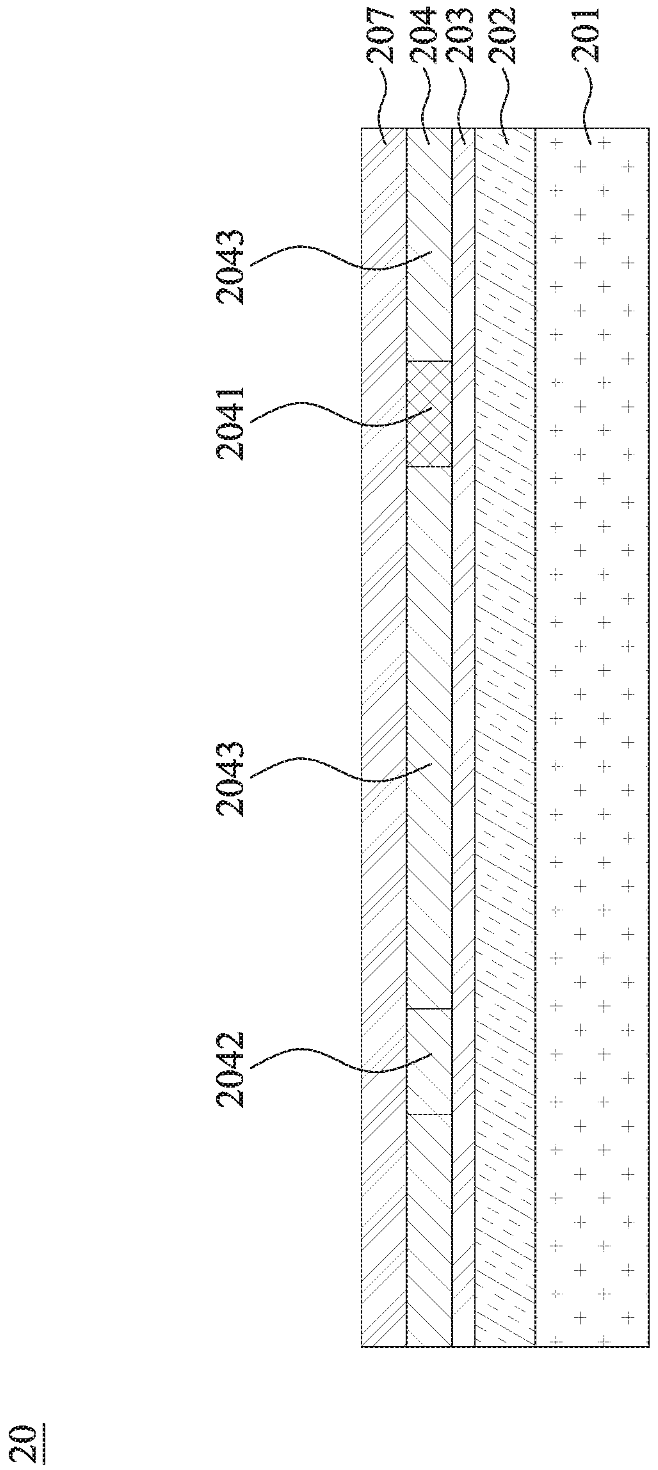

Referring to FIG. 2D, the dielectric layer 205 shown in FIG. 2C can be removed. In addition, the photo mask 206 may be detached or removed. The conductive layer 207 can be formed on the doped nitride semiconductor layer 204. The conductive layer 207 can be in direct contact with the doped nitride semiconductor layer 204. The conductive layer 207 may be formed through CVD and/or another suitable deposition step. The doped nitride semiconductor layer 204 may include several doped nitride semiconductor layers 2041, 2042 and 2043. The conductive layer 207 can be in direct contact with the doped nitride semiconductor layer 2041. The conductive layer 207 can be in direct contact with the doped nitride semiconductor layer 2042.

Figure 2E:
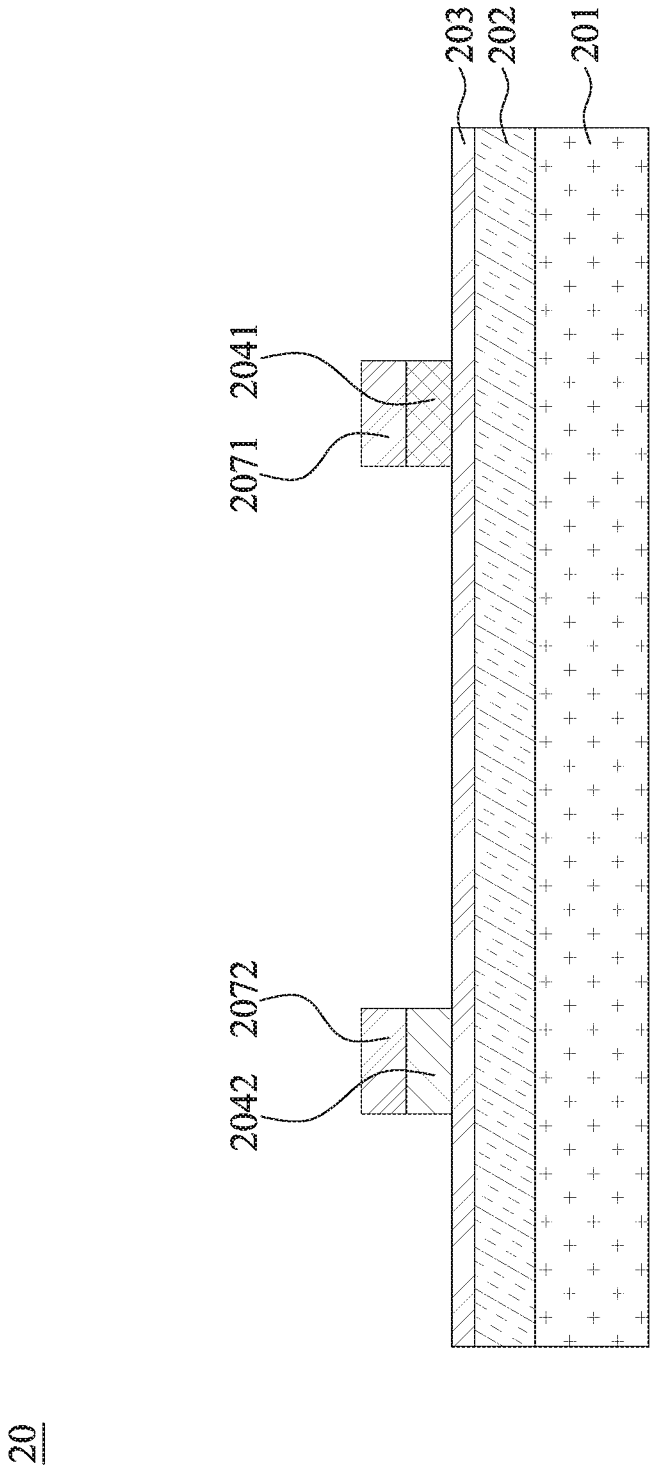

Referring to FIG. 2E, a manufacturing operation, for example, dry etching, may be performed to form the conductive structures 2071 and 2072. A manufacturing operation, for example, wet etching, may be performed to form the conductive structures 2071 and 2072. A manufacturing operation, for example, dry etching, may be performed to remove the doped nitride semiconductor layer 2043 and leave the doped nitride semiconductor layers 2041 and 2042. A manufacturing operation, for example, wet etching, may be performed to remove the doped nitride semiconductor layer 2043 and leave the doped nitride semiconductor layers 2041 and 2042. As shown in FIG. 2E, the doped nitride semiconductor layer 2041 can be formed between the nitride semiconductor layer 203 and the conductive structure 2071. The doped nitride semiconductor layer 2042 can be formed between the nitride semiconductor layer 203 and the conductive structure 2072.

Figure 2F:
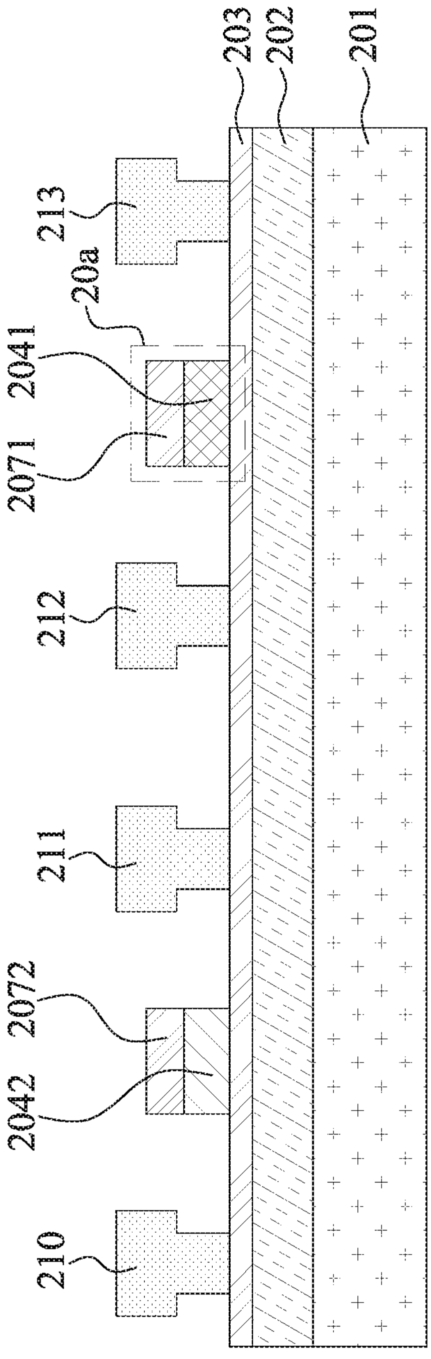

Referring to FIG. 2F, the conductive structures 210, 211, 212 and 213 can be formed on the nitride semiconductor layer 203. The conductive structures 210, 211, 212 and 213 may be formed through CVD and/or another suitable deposition step. In some embodiments, the conductive structures 210 and 211 may be formed spaced apart from the conductive structure 2072. The conductive structures 210 and 211 may be formed on opposite sides of the conductive structure 2072. The conductive structure 2072 can include a gate electrode, the conductive structure 210 can include a drain electrode or a source electrode, and the conductive structure 211 can include a source electrode or a drain electrode. In some embodiments, the conductive structures 212 and 213 may be formed spaced apart from the conductive structure 2071. The conductive structures 212 and 213 may be formed on opposite sides of the conductive structure 2071. The conductive structure 2071 can include a gate electrode, the conductive structure 212 can include a drain electrode or a source electrode, and the conductive structure 213 can include a source electrode or a drain electrode.

Figure 2G:
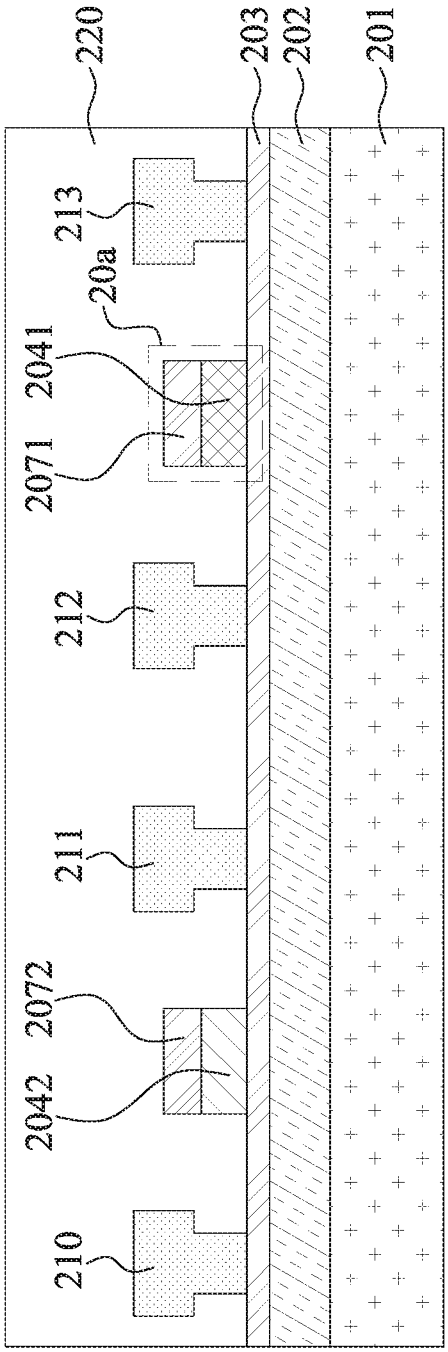

Referring to FIG. 2G, the passivation layer 220 can be formed over the nitride semiconductor layer 203. The passivation layer 220 may be formed through CVD and/or another suitable deposition step. The passivation layer 220 may be formed on the conductive structures 210, 211, 212, 213, 2071 and 2072. The doped nitride semiconductor layers 2041 and 2042, and the conductive structures 210, 211, 212, 213, 2071 and 2072 can be surrounded by the passivation layer 220. The passivation layer 220 may include silicon oxide, silicon nitride, aluminum oxide, aluminum nitride, and a combination thereof. The dopant of the doped nitride semiconductor layer 2041 may be different from the dopant of the doped nitride semiconductor layer 2042. The doped nitride semiconductor layer 2041 may be an N-type GaN layer and the doped nitride semiconductor layer 2042 may be a P-type GaN layer.

Based on the foregoing, the enhancement-mode semiconductor device and the depletion-mode semiconductor device can be provided or integrated within the semiconductor device 20 by utilizing one photo mask 206. The manufacturing process can be simple without requiring multiple photo masks. Moreover, the damage to the doped nitride semiconductor layer 204 can be reduced by applying the photo mask 206 and performing the ion implantation.

Figure 3A:
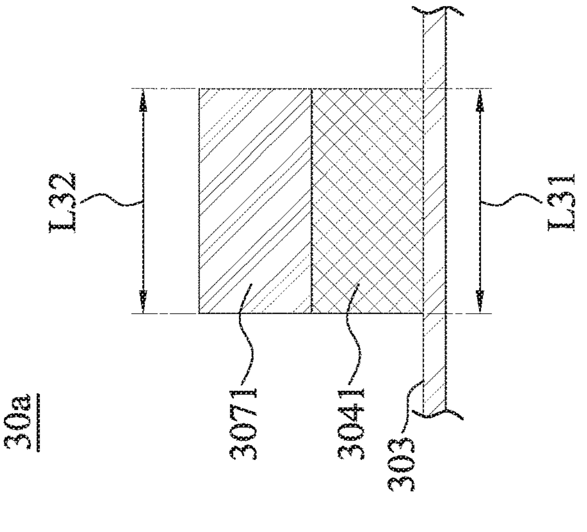
FIG. 3A is an enlarged view of the structure in the box 20*a* as shown in FIG. 2F and FIG. 2G according to some embodiments of the present disclosure.

FIG. 3A is an enlarged view 30*a* of the structure in the box 20*a* as shown in FIG. 2F and FIG. 2G according to some embodiments of the present disclosure. The conductive structure 3071 may correspond to or can be similar to the conductive structure 2071 of FIG. 2F and FIG. 2G. The doped nitride semiconductor layer 3041 may correspond to or can be similar to the doped nitride semiconductor layer 2041 of FIG. 2F and FIG. 2G. The nitride semiconductor layer 303 may correspond to or can be similar to the nitride semiconductor layer 203 of FIG. 2F and FIG. 2G.

The conductive structure 3071 may be formed on the doped nitride semiconductor layer 3041. The conductive structure 3071 may be in direct contact with the doped nitride semiconductor layer 3041. The doped nitride semiconductor layer 3041 may be formed on the nitride semiconductor layer 303. The doped nitride semiconductor layer 3041 may be in direct contact with the nitride semiconductor layer 303. In some embodiment, the conductive structure 3071 can have a length L32. The doped nitride semiconductor layer 3041 can have a length L31. The nitride semiconductor layer 303 may extend along a direction parallel with the lengths L31 and L32. The length L32 can be substantially identical to the length L31. The doped nitride semiconductor layer 3041 can include N-type doped material and P-type doped material. In the doped nitride semiconductor layer 3041, the concentration of the N-type doped material may be greater than the concentration of the P-type doped material. In the doped nitride semiconductor layer 3041, the concentration of the P-type doped material may be greater than the concentration of the N-type doped material.

Figure 3B:
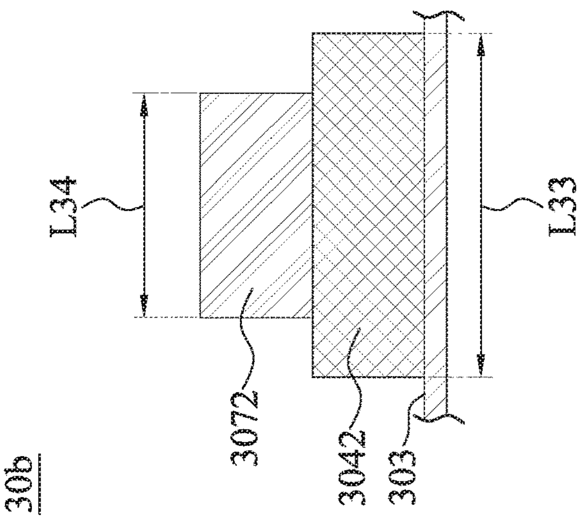
FIG. 3B is another enlarged view of the structure in the box 20*a* as shown in FIG. 2F and FIG. 2G according to some embodiments of the present disclosure.

FIG. 3B is another enlarged view 30*b* of the structure in the box 20*a* as shown in FIG. 2F and FIG. 2G according to some embodiments of the present disclosure. As shown in FIG. 3B, the conductive structure 3072 can have a length L34. The doped nitride semiconductor layer 3042 can have a length L33. The nitride semiconductor layer 303 may extend along a direction parallel with the lengths L33 and L34. The length L34 can be different from the length L33. The length L34 can be smaller than the length L33. The doped nitride semiconductor layer 3042 can include N-type doped material and P-type doped material. In the doped nitride semiconductor layer 3042, the concentration of the N-type doped material may be greater than the concentration of the P-type doped material. In the doped nitride semiconductor layer 3042, the concentration of the P-type doped material may be greater than the concentration of the N-type doped material.

Figure 3C:
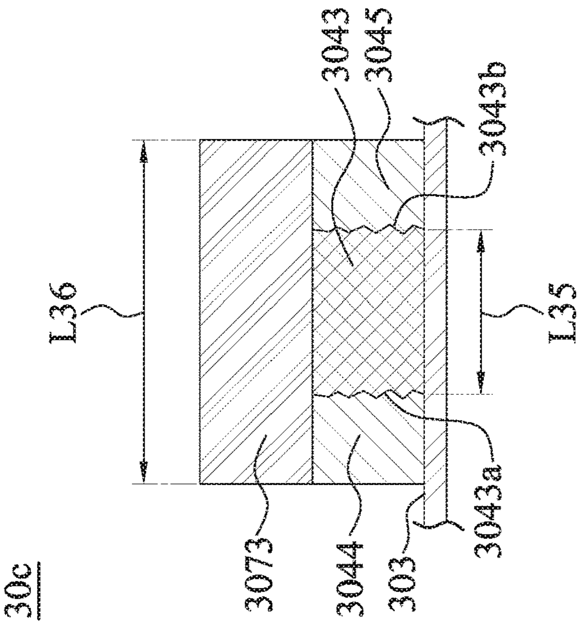
FIG. 3C is another enlarged view of the structure in the box 20*a* as shown in FIG. 2F and FIG. 2G according to some embodiments of the present disclosure.

FIG. 3C is another enlarged view 30*c* of the structure in the box 20*a* as shown in FIG. 2F and FIG. 2G according to some embodiments of the present disclosure. The conductive structure 3073 can have a length L36. The doped nitride semiconductor layer 3043 can have a length L35. The nitride semiconductor layer 303 may extend along a direction parallel with the lengths L35 and L36. The length L36 can be different from the length L35. The length L36 can be greater than the length L35. The doped nitride semiconductor layer 3043 can include N-type doped material and P-type doped material. In the doped nitride semiconductor layer 3043, the concentration of the N-type doped material may be greater than the concentration of the P-type doped material. In the doped nitride semiconductor layer 3043, the concentration of the P-type doped material may be greater than the concentration of the N-type doped material.

As shown in FIG. 3C, the doped nitride semiconductor layer 3043 may be surrounded by the doped nitride semiconductor layers 3044 and 3045. The doped nitride semiconductor layer 3043 can include N-type doped material. The doped nitride semiconductor layers 3044 and 3045 can include P-type doped material. The nitride semiconductor layer 3044 can be in direct contact with the lateral surface 3043*a* of the nitride semiconductor layer 3043. The lateral surface 3043*a* can be a rugged or irregular surface due to the manufacturing operation, such as ion implantation, performed for the nitride semiconductor layer 3043. The nitride semiconductor layer 3045 can be in direct contact with the lateral surface 3043*b* of the nitride semiconductor layer 3043. The lateral surface 3043*b* can be a rugged or irregular surface due to the manufacturing operation, such as ion implantation, performed for the nitride semiconductor layer 3043.

Figure 4:
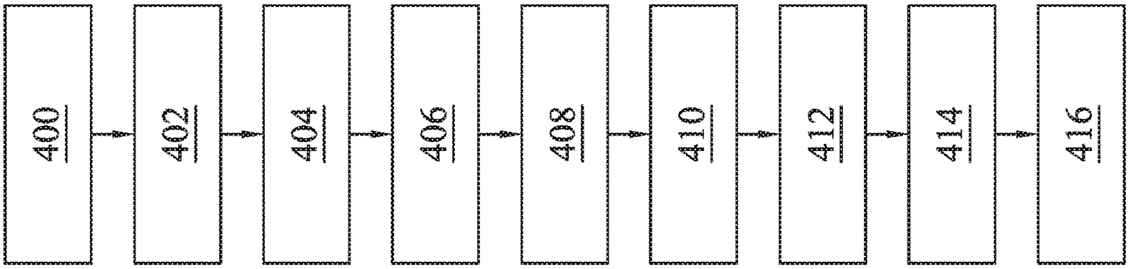
FIG. 4 illustrates some operations to manufacture a semiconductor device according to some embodiments of the present disclosure.

FIG. 4 illustrates some operations to manufacture a semiconductor device according to some embodiments of the present disclosure. While disclosed operations are illustrated and described below as a series of acts or events, it will be appreciated that the illustrated ordering of such acts or events are not to be interpreted in a limiting sense. For example, some operations may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

In operation 400, a substrate can be formed. In operation 402, a first nitride semiconductor layer can be formed on the substrate. In operation 404, a second nitride semiconductor layer can be formed on the first nitride semiconductor layer. It should be noted that the second nitride semiconductor layer may have a band gap greater than a band gap of the first nitride semiconductor layer.

In operation 406, a first doped nitride semiconductor layer can be formed on the second nitride semiconductor layer. In operation 408, a dielectric layer can be formed on the second nitride semiconductor layer. In operation 410, ion implantation can be performed on a first region of the first doped nitride semiconductor layer to form a second doped nitride semiconductor layer.

In operation 412, a conductive layer can be formed on the first doped nitride semiconductor layer and the second doped nitride semiconductor layer. In operation 414, a second portion of the first doped nitride semiconductor layer can be removed which surrounds the first portion of the first doped nitride semiconductor layer. In operation 416, at least one conductive structure can be deposited on the first doped nitride semiconductor layer and the second doped nitride semiconductor layer.

As used herein, spatially relative terms, such as "beneath," "below," "lower," "above," "upper," "higher," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms “approximately,” “substantially,” “substantial” and “about” are used to describe and account for small variations. When used in conduction with an event or circumstance, the terms can refer to instances in which the event of circumstance occurs precisely as well as instances in which the event or circumstance occurs to a close approximation. As used herein with respect to a given value or range, the term “about” generally means within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term “substantially coplanar” can refer to two surfaces within micrometers (μm) of lying along a same plane, such as within 10 μm, within 5 μm, within 1 μm, or within 0.5 μm of lying along the same plane. When referring to numerical values or characteristics as “substantially” the same, the term can refer to the values lying within ±10%, ±5%, ±1%, or ±0.5% of an average of the values.

Several embodiments of the disclosure and features of details are briefly described above. The embodiments described in the disclosure may be easily used as a basis for designing or modifying other processes and structures for realizing the same or similar objectives and/or obtaining the same or similar advantages introduced in the embodiments of the disclosure. Such equivalent constructions do not depart from the spirit and scope of the disclosure, and various variations, replacements, and modifications can be made without departing from the spirit and scope of the disclosure.

What is claimed is:

1. A semiconductor device, comprising:

a substrate;

a first nitride semiconductor layer on the substrate;

a second nitride semiconductor layer on the first nitride semiconductor layer and having a band gap greater than a band gap of the first nitride semiconductor layer;

a first doped nitride semiconductor layer on the second nitride semiconductor layer;

a second doped nitride semiconductor layer on the second nitride semiconductor layer, wherein a dopant of the first doped nitride semiconductor layer is different from a dopant of the second doped nitride semiconductor layer;

a first conductive structure on and in direct contact with the first doped nitride semiconductor layer;

a second conductive structure on and in direct contact with the second doped nitride semiconductor layer; and a third conductive structure, disposed over the second nitride semiconductor layer and between the first doped nitride semiconductor layer and the second doped nitride semiconductor layer, and spaced apart from the first doped nitride semiconductor layer and the second doped nitride semiconductor layer.

2. The semiconductor device of claim 1, wherein a height of the first doped nitride semiconductor layer is substantially identical to a height of the second doped nitride semiconductor layer.

3. The semiconductor device of claim 1, wherein the first doped nitride semiconductor layer is spaced apart from the second doped nitride semiconductor layer.

4. The semiconductor device of claim 1, wherein the first doped nitride semiconductor layer comprises P-type doped material or hydrogen, and the second doped nitride semiconductor layer comprises N-type doped material.

5. The semiconductor device of claim 4, wherein the N-type doped material comprises a group 4A element.

6. The semiconductor device of claim 5, wherein the N-type doped material comprises carbon, silicon, or germanium.

7. The semiconductor device of claim 4, wherein the N-type doped material is formed by executing a first manufacturing operation, wherein the first manufacturing operation includes ion implantation; or the N-type doped material is formed by executing a second manufacturing operation, wherein the second manufacturing operation includes diffusion.

8. The semiconductor device of claim 1, wherein a length of the second conductive structure is smaller than or equal to a length of the second doped nitride semiconductor layer; or a length of the second conductive structure is greater than a length of the second doped nitride semiconductor layer.

9. The semiconductor device of claim 1, further comprising:

a third doped nitride semiconductor layer adjacent to a lateral surface of the second doped nitride semiconductor layer, wherein a material of the third doped nitride semiconductor layer is substantially the same as a material of the first doped nitride semiconductor layer.

10. The semiconductor device of claim 1, wherein a length of the first doped nitride semiconductor layer is different from a length of the second doped nitride semiconductor layer.

11. A method for manufacturing a semiconductor device, comprising:

forming a substrate;

forming a first nitride semiconductor layer on the substrate;

forming a second nitride semiconductor layer on the first nitride semiconductor layer, the second nitride semiconductor layer having a band gap greater than a band gap of the first nitride semiconductor layer;

forming a first doped nitride semiconductor layer on the second nitride semiconductor layer;

forming a dielectric layer on the second nitride semiconductor layer;

performing ion implantation on a first region of the first doped nitride semiconductor layer to form a second doped nitride semiconductor layer;

forming a conductive layer on the first doped nitride semiconductor layer and the second doped nitride semiconductor layer, wherein the conductive layer comprises: a first conductive structure on and in direct contact with the first doped nitride semiconductor layer; and a second conductive structure on and in direct contact with the second doped nitride semiconductor layer; and forming a third conductive structure, wherein the third conductive structure is disposed over the second nitride semiconductor layer and between the first doped nitride semiconductor layer and the second doped nitride semiconductor layer, and spaced apart from the first doped nitride semiconductor layer and the second doped nitride semiconductor layer.

12. The method of claim 11, further comprising:

removing a second portion of the first doped nitride semiconductor layer, which surrounds a first portion of the first doped nitride semiconductor layer.

13. The method of claim 11, wherein the first doped nitride semiconductor layer comprises P-type doped material, and the second doped nitride semiconductor layer comprises N-type doped material;

wherein the N-type doped material comprises a group 4A element.

14. A semiconductor device, comprising:

a first operating device above a first nitride semiconductor layer, comprising:

a first doped nitride semiconductor layer on a second nitride semiconductor layer, wherein the second nitride semiconductor layer is on the first nitride semiconductor layer and the second nitride semiconductor layer has a band gap greater than a band gap of the first nitride semiconductor layer;

a first conductive structure on and in direct contact with the first doped nitride semiconductor layer; and a third conductive structure, disposed over the second nitride semiconductor layer; and a second operating device separated from the first operating device, comprising:

a second doped nitride semiconductor layer on the second nitride semiconductor layer;

a second conductive structure on and in direct contact with the second doped nitride semiconductor layer, wherein the first doped nitride semiconductor layer and the second doped nitride semiconductor layer have substantially identical thickness, wherein the third conductive structure is disposed between the first doped nitride semiconductor layer and the second doped nitride semiconductor layer, and spaced apart from the first doped nitride semiconductor layer and the second doped nitride semiconductor layer.

15. The semiconductor device of claim 14, wherein the first operating device comprises an enhancement-mode semiconductor device, and the second operating device comprises a depletion-mode semiconductor device.

16. The semiconductor device of claim 14, wherein the first doped nitride semiconductor layer comprises P-type doped material, and the second doped nitride semiconductor layer comprises N-type doped material; or the second doped nitride semiconductor layer comprises a group 4A element or a hydrogen ion material.

17. The semiconductor device of claim 16, wherein the N-type doped material is provided through executing ion implantation or diffusion.

18. The semiconductor device of claim 1, wherein the second doped nitride semiconductor layer comprises a fourth doped nitride semiconductor layer, a fifth doped nitride semiconductor layer, and a sixth doped nitride semiconductor layer, wherein a dopant of the fourth doped nitride semiconductor layer is different from dopants of the fifth doped nitride semiconductor layer and the sixth doped nitride semiconductor layer, wherein the fifth doped nitride semiconductor layer is in contact with a first lateral surface of the fourth doped nitride semiconductor layer, and the sixth doped nitride semiconductor layer is in contact with a second lateral surface of the fourth doped nitride semiconductor layer, the first lateral surface being opposite to the second lateral surface.

19. The method of claim 11, wherein the second doped nitride semiconductor layer comprises a fourth doped nitride semiconductor layer, a fifth doped nitride semiconductor layer, and a sixth doped nitride semiconductor layer, wherein a dopant of the fourth doped nitride semiconductor layer is different from dopants of the fifth doped nitride semiconductor layer and the sixth doped nitride semiconductor layer, wherein the fifth doped nitride semiconductor layer is in contact with a first lateral surface of the fourth doped nitride semiconductor layer, and the sixth doped nitride semiconductor layer is in contact with a second lateral surface of the fourth doped nitride semiconductor layer, the first lateral surface being opposite to the second lateral surface.

20. The semiconductor device of claim 14, wherein the second doped nitride semiconductor layer comprises a fourth doped nitride semiconductor layer, a fifth doped nitride semiconductor layer, and a sixth doped nitride semiconductor layer, wherein a dopant of the fourth doped nitride semiconductor layer is different from dopants of the fifth doped nitride semiconductor layer and the sixth doped nitride semiconductor layer, wherein the fifth doped nitride semiconductor layer is in contact with a first lateral surface of the fourth doped nitride semiconductor layer, and the sixth doped nitride semiconductor layer is in contact with a second lateral surface of the fourth doped nitride semiconductor layer, the first lateral surface being opposite to the second lateral surface.

* * * * *